United States Patent [19]
Atherton et al.

[11] Patent Number: 5,312,671
[45] Date of Patent: May 17, 1994

[54] ANTISTATIC DRAFTING FILMS

[75] Inventors: David Atherton, North Kingstown; Morgan E. Gager, Warwick; Sankar K. Paul, West Warwick, all of R.I.

[73] Assignee: Arkwright Incorporated, Fiskeville, R.I.

[21] Appl. No.: 702,803

[22] Filed: May 21, 1991

[51] Int. Cl.$^5$ .............................. B32B 3/00; D06N 7/04
[52] U.S. Cl. .................................. 428/143; 428/147; 428/172; 428/212; 428/327; 428/331; 430/14; 430/162
[58] Field of Search ............... 428/156, 172, 142, 147, 428/212, 327, 331, 143, 402, 206, 913; 430/14, 162

[56] References Cited

U.S. PATENT DOCUMENTS

| | | | |
|---|---|---|---|
| 3,798,032 | 3/1974 | Miller | 96/1.5 |
| 3,857,729 | 12/1974 | Burwasser | 117/73 |
| 3,900,319 | 8/1925 | Miller | 96/1.8 |
| 3,928,697 | 12/1975 | Mallinson et al. | 428/142 |
| 4,058,879 | 11/1977 | Lentz et al. | 29/132 |
| 4,241,134 | 12/1980 | Burwasser | 428/331 |
| 4,367,511 | 1/1983 | Crass et al. | 428/156 |
| 4,461,797 | 7/1984 | Adachi et al. | 428/156 |
| 4,500,598 | 2/1985 | Thoese | 428/331 |
| 4,543,316 | 9/1985 | Thoese | 430/162 |
| 4,642,263 | 2/1987 | Culbertson | 428/336 |

FOREIGN PATENT DOCUMENTS

| | | |
|---|---|---|
| 0188753 | 7/1986 | European Pat. Off. |
| 0514977 | 11/1992 | European Pat. Off. |
| 2301466 | 7/1973 | Fed. Rep. of Germany |
| 2644089 | 4/1978 | Fed. Rep. of Germany |
| 1413201 | 12/1975 | United Kingdom |
| 1448889 | 9/1976 | United Kingdom |

OTHER PUBLICATIONS

Abstracts of Japan, vol. 016, No. 060, JP 3259141 (Konica Corp), Nov. 19, 1991.
Abstracts of Japan, vol. 015, No. 001, JP2255852 (Chisso Corp), Oct. 16, 1990.

Primary Examiner—Donald J. Loney
Attorney, Agent, or Firm—Birch, Stewart, Kolasch & Birch

[57] ABSTRACT

A matte drafting sheet composite at least one side of which comprises a single polymeric matrix layer containing particulates to provide a matte or drafting surface and a quaternary ammonium salt of high charge density at a concentration sufficient to provide a resistivity of said matrix layer of at most about $1 \times 10^{13}$ ohms/square.

25 Claims, No Drawings

ANTISTATIC DRAFTING FILMS

FIELD OF THE INVENTION

This invention relates to antistatic matte thermoplastic drafting layers suitable for both manual drafting and plotting purposes.

BACKGROUND OF THE INVENTION

Matte drafting films have long been used as media for engineering drawings, and their compositions are well known in the art. Conventional drafting film construction consists of an underlayer and an overlying surface layer on at least one side of a base support such as polyethylene terphthalate. Pencil tooth for drafting purposes is obtained primarily through the underlayer which is comprised of a finely divided pigment dispersed within a cross-linked binder. The surface layer is comprised of a polymeric matrix which provides ink receptivity and adhesion, and also pencil and ink erasability. At times, the surface layer employs an antistatic agent to reduce static charge to correct the problem of static cling and attraction of foreign matter.

More recently, use of matte drafting surfaces have also been provided on the opposing side of electronically imaging media which has placed additional requirements on the drafting surface. These requirements include the following: (1) Effective inhibition of dust and dirt attraction due to static electricity. Static is particularly serious in electronic imaging processes, because dust or foreign matter will frequently cause voids and consequent loss of information. (2) Inhibition of spurious electrostatic charges which cause toner background problems, especially in electrostatic printing. (3) Reliable transport and stacking in automated imaging devices. (4) Good toner adhesion in electrophotographic imaging processes where the matte drafting surface is the imaged side. (5) Reduction in the number of layers in the matte or drafting matrix to help reduce cost and improve quality control.

Antistatic agents have long been used as a means of reducing static charge in a variety of applications. In the past, however, the use of antistatic agents in drafting media have often been accompanied by undesirable properties which has discouraged their use in such media. This has been particularly true with respect to newer electronic copying and printing applications.

The literature abounds in the listing of antistats and their applications. These antistats may be broadly classified as cationic, anionic and non-ionic. The cationic classification includes protonated amines and quaternary ammonium, sulfonium and phosphonium cations. The quaternary ammonium cations may be divided into six different sub-classes of varying structure and molecular weight. While there is an enormous diversity of both molecular structure and applications for antistats, there is little teaching to be found as to which are most appropriate for drafting surfaces. Most work for the drafting application has been empirical and has addressed a rather narrow set of product performance requirements.

SUMMARY OF THE INVENTION

The present invention provides a single-layer matte drafting surface on a film which inhibits the development of static electricity thereon. It provides a matte drafting surface with antistatic properties without causing deleterious drafting defects such as ink feathering, ink line discontinuities and pencil ghosting on erasure. It also provides a film having a single layer matte drafting surface thereon and an imaging surface on the opposing side thereof, wherein there is minimized the attraction of dust or dirt due to static and thereby also minimized voids and other visual defects in the imaging layer of the imaging and drafting film. The invention further provides an imagable matte drafting surface having good toner adhesion for electrophotographic applications and having few, if any spurious charges thereon. Thus, the present invention provides a single layer general purpose drafting surface that is advantageously suited for a variety of manual and electronic copying and printing applications.

DETAILED DESCRIPTION OF THE INVENTION

We have discovered that quaternary ammonium salts of certain molecular structure having a high charge density can provide highly advantageous and unexpectedly beneficial antistatic properties to single layer matte drafting surfaces without also producing detrimental effects on drafting and imaging properties. Importantly, these quaternary compounds are soluble in aqueous and organic solvents and are capable of significant reduction of surface resistivity with the use of relatively small quantities of the antistatic agent.

Previous use of quaternary ammonium compounds in a single layer drafting surface produced undesirable properties such as ink line feathering and discontinuities, poor erasure properties and loss of toner adhesion. The results of our discovery are unexpected as the reasons for the good performance of our high charge density quaternary compounds are not apparent. The unusually good performance of our quaternary compounds of this invention may be explained in several ways. For one, their effectiveness at low concentrations may be due to their high charge density. However, possibly the absence of fatty acids or alcohols of comparable chain length as constituents in our quaternary ammonium salt structure may also be a factor. Another possibility may be that our antistatic agents are adsorbed on the surface of the particulates. One or more of the above factors may be responsible for the unusual properties provided by the antistats of this invention, however, the present invention is not limited thereby.

Exemplary of the quaternary ammonium salts which provide unexpectedly good results when employed in the matte drafting films herein disclosed are the following formula I compounds.

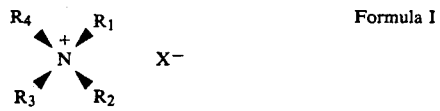

Formula I

In Formula I, $R_1$–$R_4$ and X may possess any of the following values.

$R_1$, $R_2$, $R_3$ and $R_4$ are the same or different and are selected from the group consisting of:
  substituted or unsubstituted $C_1$–$C_3$ alkyl groups wherein the alkyl groups may be substituted by hydroxy, $C_{1-3}$ alkoxy (e.g., methoxy, ethoxy, propoxy and 2-propoxy), amido (e.g., —NHC(O)H), or acyl, substituted or unsubstituted $C_2$–$C_3$ alkenyl groups wherein the alkenyl groups may be substituted by hydroxy, $C_{1-3}$ alkoxy (e.g., methoxy, ethoxy, propoxy and 2-propoxy) or amido (e.g., —NHC(O)H), and substituted or unsubstituted $C_2$-$C_3$ alkynyl groups wherein the alkynyl groups may be substituted by hydroxy, $C_{1-3}$ alkoxy (e.g., methoxy, ethoxy, propoxy and 2-propoxy), or amido (e.g., —NHC(O)H), X is the anion of a strong acid (e.g., $Cl^-$, $CH_3SO_4^-$ or $H_2PO_4^-$);

with the proviso that the formula weight of the Formula I compound cation is from 74 to about 300 amu (preferably from 74 to about 150), and that the charge density, defined below, of the quaternary ammonium cation is from $3.33 \times 10^{-3}$ to $13.5 \times 10^{-3}$ and preferably from $6.67 \times 10^{-3}$ to $13.5 \times 10^{-3}$.

The primary application of drafting films is to record information. This may be done by hand or by electronic copying or printing means on the drafting surface. Recently, drafting surfaces have been provided on the opposing side of imaging films so as to provide a means of adding or modifying information to the imaged print. Typical imaging films which are encompassed hereby would employ a drafting surface on the opposing side of the imaging layer wherein said imaging layer employs any one of a number of technologies including electrophotography (e.g. reprocopier materials), electrostatic or dielectric plotters, ink jet printing, clear or matte pen plotting, thermal transfer printing and direct thermal printing. In the case of reprocopier films, which usually have a matte layer on both sides of a film support, it is important to control the range of surface resistivity between about $1 \times 10^{10}$ to $1 \times 10^{13}$ ohms/sq. at 50% RH. If the surface resistance is much lower there will result a loss in image density. Electrostatic imaging films, however, will benefit from lower resistivity, preferably in the range of about $1 \times 10^8$ to $1 \times 10^{11}$ ohms/sq at 50% RH. This is necessary to avoid the development of static charge on the film during the various manufacturing operations. Such spurious electrostatic charges will attract toner during the developing stage of electrostatic imaging causing deleterious black or colored marks upon toning. Thus, each imaging system will have an optimum range of resistivity within a broader range of about $1 \times 10^8$ to $1 \times 10^-$ohms/square and the antistatic agents used must not only achieve this optimum range, but do so without also producing deleterious effects.

As a major application of the present invention, there is envisioned the use of unsupported clear, translucent or opaque films as the base sheet for the layers of the composite. Nonetheless, the invention also encompasses the use of any base film which would benefit from an antistatic matte or drafting surface. For example, it would be beneficial to have an antistat matte surface film in mechanical printing, such as offset printing.

There are generally two main constructions of the present invention. The first is solely for drafting purposes, either manual or electronic, such as a pen plotter. This construction may have a drafting surface on one or both sides of the film. The drafting layers of this construction may be of the same or differing composition. The second construction employs a drafting surface on one side of a film and an imaging layer on the opposite side of the film. The imaging layer may utilize any of the imaging technologies described in the foregoing section. Such imaging technologies are well known to those skilled in the art.

Polymers which may be employed in the drafting surface matrixes of the present invention include those comprised of a hard polymer with a Tukon hardness greater than about 15 and a softer polymer which is hydrophilic. In this regard, the hard polymer helps provide clean pencil erasure and dig resistance, while the softer hydrophilic polymer provides good ink receptivity without feathering, ink erasure and promotes bonding to toners. The ratio of the harder and softer polymers are generally from about 1:3 to about 6:1 and preferably they are about 3:1.

A preferred embodiment of the present invention is a single layer thermoplastic matrix comprising a 3:1 mixture of polymethyl methacrylate (PMMA) and the copolymer of polyvinyl pyrolidone and vinyl acetate (PVP-VA), silica and at least one high charge density quaternary ammonium cation and a strong acid anion.

A wide variety of pigments may be employed to achieve suitable pencil tooth or abrasivity for drafting purposes. Additionally, when a drafting surface is employed herein on the side opposite the imaging side of an imaging film, said surface must have appropriate surface roughness to feed through a copying or printing device. Drafting properties of films are characterized by pencil tooth (abrasivity), pencil line continuity and erasure and the feed properties by the static and dynamic friction. Pencil tooth and erasure are determined by standard test procedures described in Federal Specification L-P-519C. The coefficients of static and dynamic friction are respectively usually in the range of about 0.235 to 0.75 and about 0.20 to 0.70. Particulates useful herein which provide the required combination of abrasivity and friction are selected from the group consisting of crystalline silica, alumina trihydrate, calcium carbonate, amorphous silica, diatomateous earth, calcined clay, organic pigments, and the like.

The antistatic agents which are useful in the present invention are quaternary ammonium salts of high charge density which are soluble in organic solvents or water as utilized in drafting formulations. The Formula I compounds outlined above are useful as such antistat agents. In general, the antistatic agents encompassed hereby should not polymerize in drafting film formulations. In this respect, polymerization is not believed to be desirable as it is likely to reduce the effectiveness of the antistats.

For the purpose of this invention, charge density is defined herein as the number of ionizable groups divided by the formula weight of the quaternary ammonium cation. The number of ionizable groups for the antistatic agents described herein is one. Thus, the lower the formula weight of the cation the higher the charge density.

For example, the $(CH_3)_4N^+$ cation has a mass of 74 amu and a charge of 1, so that the cationic charge density of 1 divided by 74 is $13.5 \times 10^{-3}$. The desired antistatic properties are achieved by a charge density, in the range of $3.33 \times 10^{-3}$ to $13.5 \times 10^{-3}$ and preferably in the range of $6.67 \times 10^{-3}$ to $13.5 \times 10^{-3}$. The anionic constituent of the quaternary ammonium salt usually is derived from any of a number of strong acids. Typically $Cl^-$, $CH_3SO_4^-$ and $H_2PO_4^-$. The choice of anion helps determine the water and organic solvent solubility of the quaternary salt.

Those of Formula I provided herein, typical compounds exemplifying said class of antistats include Calgon's dimethyl diallyl ammonium chloride, Allied Colloid's DP6-4143 and DuPont Chemical's AVITEX E. The effective concentration of the antistat agent in drafting layer formulations should provide a surface resistivity of at most $1 \times 10^{-}$ohms/sq at 50% RH. In this respect, a concentration in the range of about 0.3 to about 0.5% by weight will achieve a resistivity of about $1 \times 10^{12}$ ohms/sq and a concentration of about 0.8–1.2% by weight will provide a resistivity of about $1 \times 10^{10}$ ohms/sq, both at 50% RH. In both instances the resistivity will be higher or lower depending on the formulation employed and the thickness of the film. The lower concentrations of antistats utilized in this invention help avoid the deleterious effects of previously employed antistatic agents.

The antistats which are useful herein are either commercially available or can easily be manufactured by those of ordinary skill in the art, through known methodology and reaction sequences.

The supporting layer of the present invention is a polymeric material which has suitable dimensional stability, transparency or opacity, tensile strength, adhesion characteristics, thermal stability and hardness. Suitable polymeric materials for use as a supporting layer are transparent or opaque thermoplastic polymers, including polyesters, polysulfones, cellulose acetate, polycarbonates, polystyrene, polyimides, polyolefins, poly(methyl methacrylate), cellulose esters such as cellulose acetate and others. A polyethylene terephthalate polyester film is particularly preferred The thickness of the layer is not particularly restricted, but typically is in the range of about 2 to 10 mils, preferably about 3.0 to about 5.0 mils. The supporting layer may be pretreated to enhance adhesion of the polymeric coating thereto.

Although this invention pertains to matte drafting surfaces, the present discovery may also be applied to the manufacture of imaging surfaces such as clear plotting, electrophotographic and ink jet films.

The following Examples are provided to further aid those desiring to practice the present invention. However, the present invention is not limited thereby.

EXAMPLE I

Onto a 4 mil ICI MELINEX 505 polyester film, a mixture of the following composition is coated, using an 18 Mayer rod to give a dried coating thickness approximately 0.30–0.35 mil. The coating is dried at 120° C. for 60 seconds.

| | Composition | % By Weight |
|---|---|---|
| 1. | MIN-U-SIL Grind Composition* | 28.84 |
| 2. | Polyvinyl Pyrollidone-Vinyl acetate Copolymer (E-735), manufacturing by GAF at 50% w/w | 8.83 |
| 3. | ACRYLOID A101, manufacturing by Rohm & Haas at 40% solid W/W | 29.43 |
| 4. | Propylene Glycol Monomethyl Ether | 30.78 |
| 5. | TINT AYD AC-66-04, manufacturing by Daniel at 82% solid w/w | 1.12 |
| 6. | AVITEX E, manufacturing by DuPont at 40% solid w/w | 1.00 |

Ingredients are mixed under stirring in order listed.

| * MIN-U-SIL Grind Composition | % By Weight |
|---|---|
| 10 micron MIN-U-SIL (Pennsylvania Glass Sand Corporation) | 57.95 |
| Propylene Glycol Monomethyl Ether | 29.07 |
| ACRYLOID A101, (Rohm & Haas) 40% w/w | 11.15 |
| MPA - 2000X (NL Industries, Inc.) | 1.83 |

Ingredients are charged into a ball mill and milled for 12 hours.

The coated sheet is tested for surface resistivity at 50% RH and found to be $1 \times 10^{10}$ Ohm/sq. The ink and pencil drafting and erasure properties of the drafting surface were evaluated according to standard manual test procedures with excellent results being achieved therewith.

EXAMPLE II

The coated film as described in Example I is coated on the opposing side with an electrostatic imaging formulation as described in Example I of U.S. patent application Ser. No. 07/514,217, filed on Apr. 25, 1990, which is incorporated herein by reference. The imaging side of the sheet is printed on a VERSATEC electrostatic plotter and provided excellent results without any electrostatic background from the toner being noticed.

EXAMPLE III

Example I is repeated using $DP_6$-4143, 1.1% weight. The coated sheet is tested for surface resistivity at 50% and there was found a resistivity of $5 \times 10^{10}$ Ohms/sq.

EXAMPLE IV

Onto a 4 mil ICI MELINEX 505 polyester film, a mixture of the following composition is coated using an 18 Mayer rod to give a desired coating thickness 0.3–0.35 mil. The coating is dried at 120° C. for 60 seconds.

| | Composition | % By Weight |
|---|---|---|
| 1. | MIN-U-SIL Grind | 29.44 |
| 2. | Polyvinyl Pyrollidone - Vinyl Acetate copolymer (E-735), manufacturing by GAF at 50% w/w | 8.66 |
| 3. | ACRYLOID A101, manufacturing by Rohm & Haas at 40 solid w/w | 29.44 |
| 4. | Propylene Glycol Monomethyl Ether | 31.41 |
| 5. | TINT AYD AC-66-04, manufacturing by Daniel at 80% solid w/w | 0.71 |
| 6. | $DP_6$-4143, manufacturing by Allied Colloids at 50% solid w/w | 0.34 |

Ingredients are mixed under stirring in the order mentioned. The coated sheet is tested for surface resistivity at 50% RH and found to possess a resistivity of $7 \times 10^{11}$ ohms/sq. The ink and pencil drafting and erasure properties of the drafting surface were evaluated according to standard test procedures with excellent results being obtained.

EXAMPLE V

The same formulation as in Example IV was coated on both sides of the polyester substrate and was evaluated in a XEROX 2510 reprocopier. Results indicated that excellent toner adhesion and transport were obtained.

EXAMPLE VI

Example IV is repeated using 0.22% weight of diallyl dimethyl ammonium chloride (Calgon Corporation, 65% solid w/w) instead of $DP_6$-4143. The coated sheet is tested for surface resistivity at 50% RH and found $5 \times 10^{11}$ ohms/sq. This sheet was evaluated for both manual drafting properties and in XEROX 2510 reprocopier, both provided excellent results.

EXAMPLE VII

Example IV is repeated using each of the following quaternary ammonium salt of Formula I in separate trials wherein $R_1$-$R_4$ and X are as defined in Formula I.

|     | $R_1$ | $R_2$ | $R_3$ | $R_4$ | X |
|-----|-------|-------|-------|-------|---|
| (a) | $-CH_3$ | $-CH_3$ | $-CH_3$ | $-CH_3$ | $Cl^-$ |
| (b) | $-CH_3$ | $-CH=CHOH$ | $-CH_3$ | $-CH_2-CH_3$ | $CH_3SO_4^-$ |
| (c) | $-CH=CH_2$ | $-CH(CH_3)_2$ | $-CH_3$ | $-CH_3$ | $H_2PO_4^-$ |
| (d) | $-CH_2NHC(O)H$ | $-CH_3$ | $-CH_3$ | $-CH=CH_2$ | $Cl^-$ |
| (e) | $-C\equiv CH$ | $-CH=CH_2$ | $-CH_3$ | $-CH_2OCH_3$ | $Cl^-$ |
| (f) | $-CH_3$ | $-CH_2C(O)CH_3$ | $-CH_3$ | $-CH_2CH_3$ | $H_2PO_4^-$ |

Each of the sheets which is produced and is tested for surface resistivity and good results are achieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A film composite comprising a substrate having on at least one side thereof a polymeric matrix layer which provides a matte drafting surface to the film composite and which contains particulates and a quaternary ammonium salt, the cation of the quaternary ammonium salt having a charge density of from $3.33 \times 10^{-3}$ to $13.5 \times 10^{-3}$ at a concentration sufficient to provide a surface resistivity of said matrix layer of at most about $1 \times 10^{13}$ ohms/square at 50% RH.

2. A film composite as recited in claim 1, wherein the charge density of the quaternary ammonium cation is from $6.67 \times 10^{-3}$ to $13.5 \times 10^{-3}$ at a concentration sufficient to provide a surface resistivity of said matrix layer of at most about $1 \times 10^{13}$ ohms/square at 50% RH.

3. A film composite as recited in claim 1 or 2, wherein said matrix layer has a surface resistivity of about $1 \times 10^8$ to $1 \times 10^{13}$ ohms/square.

4. A film composite as recited in claim 1 or 2, wherein said matrix layer has a surface resistivity of about $1 \times 10^{10}$ to $1 \times 10^{13}$ ohms/square.

5. A film composite as recited in claim 1 or 2, wherein said quaternary ammonium salt contains an anion of a strong acid.

6. A film composite as recited in claim 5, wherein said anion is selected from the group consisting of $Cl^-$, $CH_3SO_4^-$ and $H_2PO_4^-$.

7. A film composite as recited in claim 5, wherein the quaternary ammonium salt is encompassed by the following Formula I:

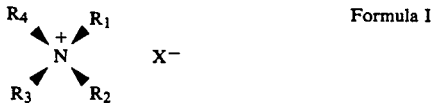

Formula I wherein $R_1$, $R_2$, $R_3$ and $R_4$ are the same or different and are selected from the group consisting of: substituted or unsubstituted $C_1$-$C_3$ alkyl groups wherein the alkyl groups may be substituted by hydroxy, $C_{1-3}$ alkoxy, amido or acyl, substituted or unsubstituted $C_2$-$C_3$ alkenyl groups wherein the alkenyl groups may be substituted by hydroxy, $C_{1-3}$ alkoxy or amido, and substituted or unsubstituted $C_2$-$C_3$ alkynyl groups wherein the alkynyl groups may be substituted by hydroxy, $C_{1-3}$ alkoxy or amido, and X is the anion of a strong acid;

with the proviso that the formula weight of the Formula I compound cation is from 74 to about 300 amu.

8. A film composite as recited in claim 1 or 2, wherein on a side of the film opposite the matte drafting surface is an image-forming layer.

9. A film composite as recited in claim 1 or 2, wherein said film composite comprises two separate matte drafting surfaces on opposite sides thereof.

10. A film composite as recited in claim 1, wherein the quaternary ammonium salt is present in the polymeric matrix layer in an amount of from about 0.3 to 1.2% by weight.

11. A film composite comprising a substrate having on at least one side thereof a thermoplastic polymeric matrix layer which provides a matte drafting surface to the film composite and which contains particulates and a quaternary ammonium salt of the following Formula I:

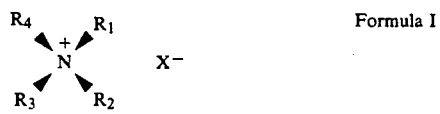

Formula I wherein $R_1$, $R_2$, $R_3$ and $R_4$ are the same or different and are selected from the group consisting of: substituted or unsubstituted $C_1$-$C_3$ alkyl groups wherein the alkyl groups may be substituted by hydroxy, $C_{1-3}$ alkoxy, amido or acyl, substituted or unsubstituted $C_2$-$C_3$ alkenyl groups wherein the alkenyl groups may be substituted by hydroxy, $C_{1-3}$ alkoxy or amido, and substituted or unsubstituted $C_2$-$C_3$ alkynyl groups wherein the alkynyl groups may be substituted by hydroxy, $C_{1-3}$ alkoxy or amido, and X is the anion of a strong acid;

with the proviso that the formula weight of the Formula I compound cation is from 74 to about 300 amu and that the charge density of the quaternary ammonium cation is from $3.33 \times 10^{-3}$ to $13.5 \times 10^{-3}$, and that the cation is present at a concentration sufficient to provide a surface resistitivy of said matrix layer of at most about $1 \times 10^{13}$ ohms/square at 50% RH.

12. A film composite as recited in claim 11, wherein the charge density of the Formula I compound cation is from $6.67 \times 10^{-3}$ to $13.5 \times 10^{-3}$ at a concentration sufficient to provide a surface resistivity of said matrix layer of at most about $1 \times 10^{13}$ ohms/square at 50% RH.

13. A film composite as recited in claim 11 or 12, wherein the Formula I compound anion is selected from the group consisting of $Cl^-$, $CH_3SO_4^-$ and $H_2PO_4^-$.

14. A film composite as recited in claim 11 or 12 wherein on a side of the film opposite the matte drafting surface is an image-forming layer.

15. A film composite as recited in claim 14, wherein the image-forming layer is an electrostatic imaging layer.

16. A film composite as recited in claim 11 or 12, wherein said film composite comprises two separate matte drafting surfaces on opposite sides thereof.

17. A film composite as recited in claim 11, wherein the quaternary ammonium salt is present in the polymeric matrix layer in an amount of from about 0.3 to 1.2% by weight.

18. A film composite comprising a substrate having on one side thereof a thermoplastic polymeric matrix layer which provides a matte drafting surface to the substrate, and on a side opposite the matte drafting surface of the film an image-forming layer,
wherein, said matte drafting surface contains a particulate and a quaternary ammonium salt, the cation of the quaternary ammonium salt having a charge density of from $3.33 \times 10^{-3}$ to $13.5 \times 10^{-3}$ at a concentration sufficient to provide a surface resistivity of said matrix layer of at most about $1 \times 10^{13}$ ohms/square at 50% RH.

19. A film composite as recited in claim 18, wherein the charge density of the quaternary ammonium cation is from $6.67 \times 10^{-3}$ to $13.5 \times 10^{-3}$ at a concentration sufficient to provide a surface resistivity of said matrix layer of at most about $1 \times 10^{13}$ ohms/square at 50% RH.

20. A film composite as recited in claim 18 or 19, wherein said quaternary ammonium salt contains an anion of a strong acid.

21. A film composite as recited in claim 20, wherein said anion is selected from the group consisting of $Cl^-$, $CH_3SO_4^-$ and $H_2PO_4^-$.

22. A film composite as recited in claim 18 or 19, wherein said quaternary ammonium salt is encompassed by the following Formula I:

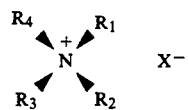

Formula I wherein $R_1$, $R_2$, $R_3$ and $R_4$ are the same or different and are selected from the group consisting of:
substituted or unsubstituted $C_1$-$C_3$ alkyl groups wherein the alkyl groups may be substituted by hydroxy, $C_{1-3}$ alkoxy, amido or acyl, substituted or unsubstituted $C_2$-$C_3$ alkenyl groups wherein the alkenyl groups may be substituted by hydroxy, $C_{1-3}$ alkoxy or amido, and substituted or unsubstituted $C_2$-$C_3$ alkynyl groups wherein the alkynyl groups may be substituted by hydroxy, $C_{1-3}$ alkoxy or amido; and X is the anion of a strong acid;
with the proviso that the formula weight of the Formula I compound cation is from 74 to about 300 amu.

23. A film composite as recited in claim 18, wherein the quaternary ammonium salt is present in the polymeric matrix layer in an amount of from about 0.3 to 1.2% by weight.

24. A film composite as recited in claim 22, wherein the quaternary ammonium salt is present in the polymeric matrix layer in an amount of from about 0.3 to 1.2% by weight.

25. A film composite comprising a substrate having on at least one side thereof a single polymeric matrix layer which provides a matte drafting surface to the film composite and which contains particulates and a quaternary ammonium salt, the cation of the quaternary ammonium salt having a charge density of from $3.33 \times 10^{-3}$ to $13.5 \times 10^{-3}$ at a concentration sufficient to provide a surface resistivity of said matrix layer of at most about $1 \times 10^{13}$ ohms/square at 50% RH.

* * * * *